United States Patent [19]

Geib

[11] Patent Number: 4,761,140

[45] Date of Patent: Aug. 2, 1988

[54] MINIMUM INSERTION FORCE SELF-CLEANING ANTI-OVERSTRESS PLCC RECEIVING SOCKET

[75] Inventor: James F. Geib, Smithfield, R.I.

[73] Assignee: Augat Inc., Mansfield, Mass.

[21] Appl. No.: 17,271

[22] Filed: Feb. 20, 1987

[51] Int. Cl.4 ............................................. H01R 23/72
[52] U.S. Cl. ........................................ 439/71; 439/331
[58] Field of Search ............... 339/17 CF, 17 M, 174, 339/75 M, 75 MP, 176 MP; 439/68–73, 330, 331, 525, 526

[56] References Cited

U.S. PATENT DOCUMENTS

| | | | |
|---|---|---|---|
| 3,878,344 | 4/1975 | Lockard | 200/6 |
| 4,080,037 | 3/1978 | Kunkle et al. | 339/258 |
| 4,168,878 | 9/1979 | Risser et al. | 339/217 |
| 4,330,163 | 5/1982 | Aikens et al. | 339/17 CF |
| 4,341,433 | 7/1982 | Cherian et al. | 439/331 |
| 4,502,747 | 3/1985 | Bright et al. | 339/17 CF |
| 4,583,812 | 4/1986 | Gross, Jr. et al. | 339/259 |
| 4,601,525 | 7/1986 | Kandybowski | 339/17 CF |
| 4,602,838 | 7/1986 | Davis et al. | 339/91 |
| 4,620,762 | 11/1986 | Davis et al. | 339/91 |

Primary Examiner—Neil Abrams
Attorney, Agent, or Firm—Weingarten, Schurgin, Gagnebin & Hayes

[57] ABSTRACT

The disclosed PLCC receiving socket includes monolithic, integrally formed socket body and cover members that have complementary latching and pivoting elements cooperative to provide a latch/release pivoting action of cover. The cover includes resilient beam fingers and the socket body has curved-beam-spring contacts received therein which act in directions parallel to the directions of PLCC insertion and removal. The openings in which the curved-beam-spring contacts are received include anti-overstress partitions that limit the travel of the curved-beam-spring contacts to within their elastic region, and that provide reaction bearings against which the curved-beam-spring of the contacts react to bear against the J-leads. Both the cover and the body are low material cost and production cost single-piece items readily fabricated by injection molding, metal cutting and stamping operations.

24 Claims, 4 Drawing Sheets

MINIMUM INSERTION FORCE SELF-CLEANING ANTI-OVERSTRESS PLCC RECEIVING SOCKET

FIELD OF THE INVENTION

The invention disclosed herein is directed to the field of electrical interconnection components, and more particularly, to a novel minimum insertion force socket for plastic leaded chip carriers having self-cleaning anti-overstress contacts and integral cooperative snap-latchable pivoting cover and insulative socket members.

BACKGROUND OF THE INVENTION

Electronic circuit devices are commonly encapsulated in so-called plastic leaded chip carrier configurations. The plastic leaded chip carrier (PLCC) includes a generally rectanguloid body having four peripheral sides. Multiple J-leads extend through the four peripheral sides a short lateral distance, then depend downwardly to a point just beyond the bottom surface of the PLCC, and then extend inwardly towards the corresponding side and terminate in a short upstanding flange that confronts the bottom portion of the PLCC. The heretofore sockets in which such plastic leaded chip carriers are received and by whhich the received PLCC's are mounted to printed circuit boards are disadvantageous in several important respects. In the first place, the heretofore known sockets have resilient contacts that electrically and mechanically contact corresponding J-leads that act in directions generally perpendicular to the direction of insertion and removal of the PLCC, whereby the cummulative lateral force on the several contacts is of such a magnitude as to require a special tool to enable PLCC insertion and removal. The sockets are thus cumbersome and quite unhandy to use. A second disadvantage of the lateral force sockets is that the lateral forces not only tend to deform the profiles of the J-leads, which leads to failure of electrical contact and device malfunction, but also induce cracking strains in the plastic encapsulations, which leads to loss of body integrity. As a result, the heretofore known sockets have a life that is limited to less than ten (10) insertion/withdrawal cycles, which is in itself disadvantageous, and which, in view of the comparative complexity of the sockets, makes them quite expensive from a materials, a production and a replacement standpoint.

SUMMARY OF THE INVENTION

The present invention contemplates as one of its objects a plastic leaded chip carrier socket that applies PLCC retaining forces only in directions substantially parallel to the directions of device insertion and removal whereby zero or minimal insertion forces are required for device insertion and removal so that the PLCC can with facility be hand inserted into and removed from the sockets without the need for any tools.

The novel PLCC socket of the present invention achieves this object and discloses to this end a resilient cover and cooperative resilient contacts embedded in a socket body that are operative to apply forces only in directions parallel to the directions of device insertion and removal whereby PLCC devices may be inserted and removed into and out of a socket manually without encountering any or only quite minimal insertion and removal forces. The cover includes resilient beam spring depending fingers operative to urge PLCC devices downwardly into the socket. The contacts include curved-beam-spring portions operative to urge contacting portions thereof upwardly into mechanical and electrical contact with the corresponding J-leads of the PLCC devices.

The present invention contemplates as a further object a PLCC socket body and socket embedded contacts so cooperative with the body of the socket that the contacts cannot be deflected to an over-stress condition during multiple PLCC device insertion and removal whereby the contacts retain their resiliency ensuring a long cycle life as well as continued socket body integrity.

The present invention achieves this further object and discloses contacts having cantilevered curved-beam-spring portions that urge J-lead contacting portions into contact with the J-leads. The cantilevered curved-beam-spring portion of the contacts is received in corresponding chambers provided therefor in the socket body, which are so dimensioned that in the inserted condition of the PLCC devices the curved-beam-spring portions are free from mechanical interference with the walls of the chamber in which they are received whereby they always retain their shape and inherent resiliency. Plural combination anti-overstress and curved-beam-spring deflection abutments are provided adjacent the curved-beam-spring receiving chambers to both limit the deflection of the contacting portions of the contact as well as providing a stop against which the curved-beam springs are compressed and thereby urge the contacting portions into mechanical and electrical contact with the confronting surfaces of the J-leads without thereby straining the socket bodies.

The present invention contemplates as an additional object a PLCC socket having contacts that provide a self-cleaning action during PLCC device insertion to insure that the optimum mechanical and electrical interconnection between the several contacts and J-leads occurs.

The present invention achieves this additional object and discloses seating the cantilevered curved-beam-spring contacts in the insulative socket body such that the downward movement of the PLCC device during insertion moves the contacting portion of the contacts downwardly and in such a way that the bottom flat of the corresponding J-leads is wiped as the corresponding contacting portion slides out from under the bottom flat as it pivots to the combination anti-overstress and curved-beam-spring deflection abuttment.

The present invention contemplates as yet a further object a very low cost PLCC receiving socket, and it achieves this yet further object and discloses a monolithic cover member and a monolithic socket body having cooperative complementary integrally formed pivot defining elements and cooperative complementary integrally formed snap-releasable latch elements. The monolithic body includes an integral mechanical polarizer chamfered corner, and chamfered corners defining PLCC alignment surfaces. The monolithic cover includes an integral strengthening, U-shaped rib and an unstregthened wall that are cooperative with resilient depending integral resilient beam fingers to move cover latch arms toward and away from each other in response to pivoting the cover from its open to its closed condition.

BRIEF DESCRIPTION OF THE DRAWINGS

Other objects, aspects, and advantages of the present invention will become apparent as the invention becomes better understood by referring to the following solely exemplary and non-limiting detailed description thereof, and to the drawings, wherein.

DETAILED DISCLOSURE OF THE INVENTION

Figure 1:
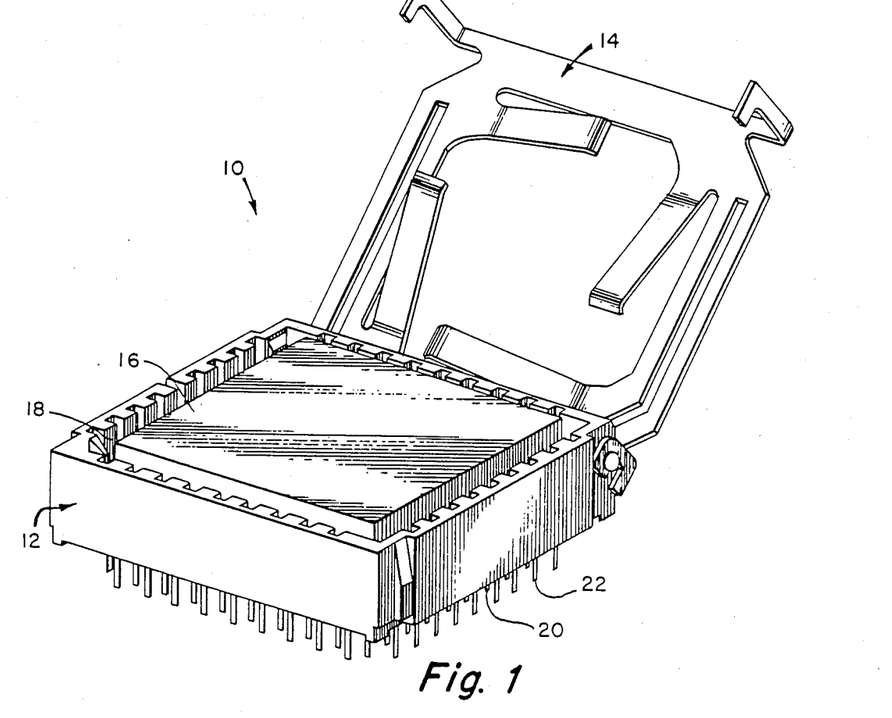
FIG. 1 is a perspective view of the socket of the invention with a plastic leaded chip carrier device inserted thereinto and with the cover open.

Referring now to FIG. 1, generally designated at 10 is a perspective view of a presently preferred embodiment of the minimal insertion force socket for plastic leaded chip carriers (PLCC) having self-cleaning anti-overstress contacts and integral cooperative snap-latchable pivoting cover and insulative socket body members of the present invention with a PLCC device inserted thereinto and with the cover open. The socket 10 includes a monolithic, generally rectanguloid insulative socket body generally designated 12, and a monolithic cover generally designated 14 pivotally mounted in a manner to be described to the socket body 12. The monolithic socket body 12 is integrally formed by any suitable technique, such as injection-molding, and is fashioned out of any suitable material, such as a VECTRA A150 liquid crystal polymer. For the exemplary VECTRA A150 material of the insulator, its wear resistance is such that the cover may be cycled open and closed at least 50 times, without significant fatigue. A plastic leaded chip carrier (PLCC) 16 is received by an open top surface generally designated 18 provided therefor by the walls of the rectanguloid insulative socket body 12. The insertion of the PLCC 16 is readily accomplished manuallly, simply by placing the PLCC 16 onto the top 18 of the body 12, since no significant resistance force is experienced during the insertion. A mechanical polarizer, to be described, and centering surfaces, to be described, which are formed as part of the inside walls of the insulative socket body 12, insure that the PLCC 18 is correctly oriented and aligned in the insulative body, prior to cover closure. J-leads of the PLCC 16 individually mechanically contact corresponding ones of inner contacts 22 and outer contacts 24 frictionally retained in the insulative socket body 12, by which electrical interconnection is established with the circuit traces of a printed wiring board into which the socket 10 is usually inserted. The PLCC 16 is releasably retained in the insulative body by pivoting the cover 14 downwardly until it releasably latches the insulative socket body in a manner to be described. For chip replacement and/or testing, the cover is simply pressed manually, or with a tool, in a manner to be described, whereby it springs into its open illustrated condition, and the PLCC 16 is readily removable, simply by manipulating it with the hand.

Figure 2:
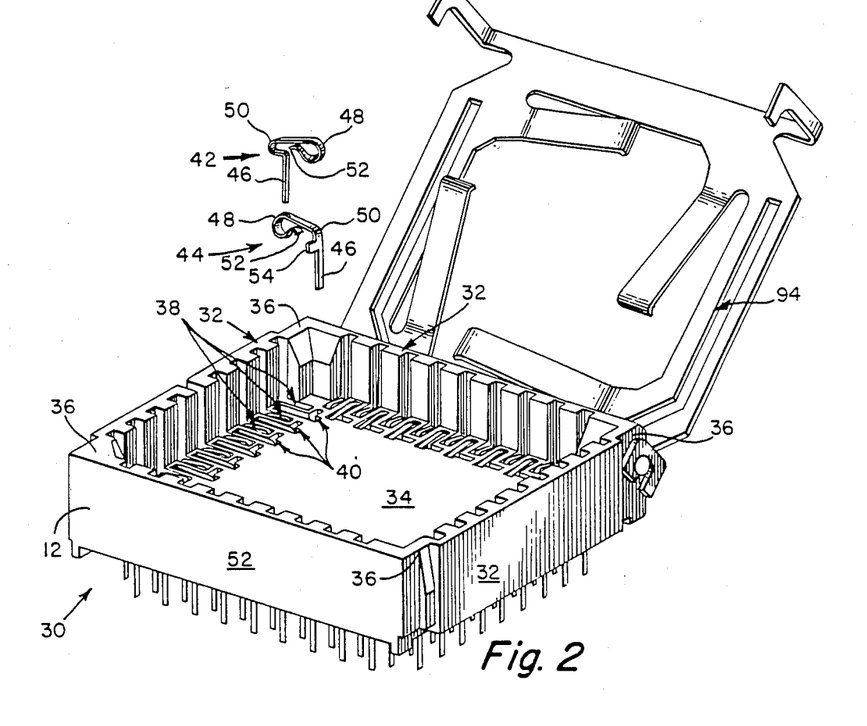
FIG. 2 is a partially exploded perspective view of the preferred embodiment of the invention with the PLCC removed and showing exploded an inner and an outer contact thereof.

Referring now to FIG. 2, generally designated at 30 is a partially exploded perspective view of the exemplary embodiment of the invention with the plastic leaded chip carrier removed and showing in exploded condition an inner and an outer contact of the inner and outer contact rows. The insulative socket body 12 includes four side walls generally designated 32 that are interconnected by a central web generally designated 34 that extends between the several side walls 32 for providing structural strength to the body. The web 34 is exemplary only, and bodies defining central opening, which are of the requisite structural strength, are also contemplated. The walls 32 may extend above the web 34 as illustrated, or the walls may terminate at the same height as the web 34, or may extend to a position different than that illustrated. At the corners of the body 12, upstanding post portions 36 are integrally formed with the insulative body 12. 8urfaces to be described are integrally formed with selected corners to mechanically polarize the socket such that the PLCC can only be inserted in one orientation, and surfaces are integrally formed therewith to provide a PLCC alignment and centering action.

A first row of outer opening generally designated 38 is provided in the insulative socket body adjacent the peripheral surface of the side walls thereof, and a second inner row of openings generally designated 40 is provided through the insulative body in interdigited relation with those of the first row of holes. Into each of the outer holes a contact generally designated 42 is inserted, and into each of the inner holes 40 a contact generally designated 44 is inserted. The contacts 42, 44 alternate along each of the sides 32 of the body 12, on a selected center-to-center spacing, which spacing is selected to correspond to the canter-to-center spacing of the J-leads of the PLCC. The spacing between the opening along each of the inner and outer rows, however, corresponds to the standard spacing on the printed wiring board. In this way, the openings geometry matches the center-to-center spacing on the PLCC J-leads to a standard center-to center spacing adapted for the printed wiring board.

The contacts 42, 44 each have a tail 46. It is the tail 46 that is received through the openings provided in the insulative housing body and that interconnects with the printed wiring board. At the other end of the several contacs 42, 44 the contacts close on themselves defining curved-beam-spring portions 48. The portions 48 extend between a flat, slightly upwardly inclined contacting portion 50, and a termination portion 52, on the several inner and outer contacts 42, 44. On the outer row of contacts 42, the loop portion 48 thereof is generally axially in line with the tail portion 46 thereof, while with respect to the inner contacts 44, the loop portion 48 is laterally offset from the corresponding tail 46 via a bight 54. The bights have a length selected such that the inner row of contacts in their inserted condition interdigit adjacent outer contacts. The inner and outer row of contacts 42, 44 are otherwise identical structurally, but are inserted facing each other, so that the contacting portions thereof present effectively axially aligned surfaces to the confronting portions of the J-leads.

Figure 3:
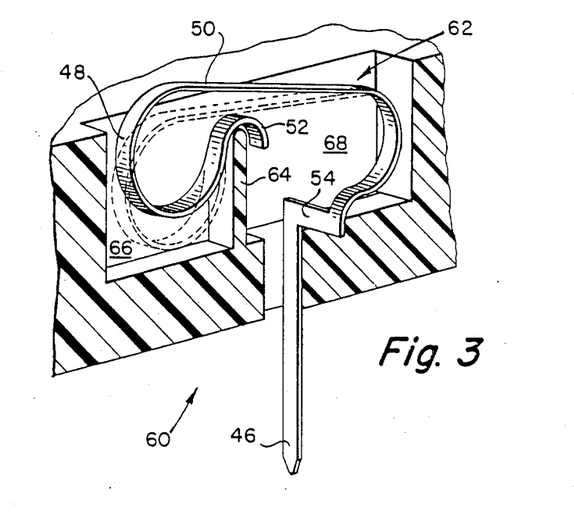
FIG. 3 is a partial perspective view of an inner contact in its socket opening in an undeflected condition in solid outline and in a deflected condition in dashed outlined.

Referring now to FIG. 3, generally designated at 60 is a partial perspective view illustrating an inner contact slidably received in the socket opening provided therefor. The outer contact is identical with the inner contact insofar as the recess provided therefor is concerned. The only difference between the inner and outer contacts is that for each of the inner contacts the corresponding socket receiving recess has a right angled channel formed therein to receive the lead, which channel is in communication with the socket recess and accommodates the bight 54 of the several inner leads.

Socket receiving openings generally designated 62 have an upstanding partition 64 that divides the openings 62 into a loop end receiving chamber generally designated 66 and a contact tail receiving chamber generally designated 68. The position of the partition 64 for each of the inner and outer contacts is selected such that the free end of the partition confronts the terminal member 52 of the several contacts. The openings 64 for the several contacts are the same, except that for the outer row of contacts the loop receiving chamber is located inwardly, while for the inner row of contacts the loop receiving chamber is located outwardly, which, as already disclosed, provides effective axial contact alignment, so as to mechanically and electrically contact corresponding bottom portions of the J-leads of the PLCC received thereonto.

The dimensions of the loop end receiving chambers 66 are selected with respect to the dimensions of the loop end of the several contacts 42, 44 (FIG. 2) such that the loop end is free from mechanical interference with the walls defining the loop end receiving chambers. In this way, the loop end does not mechanically contact the walls, which thereby prevents its undesirable deformation, whereby it always maintains its resiliency cycle-to-cycle. In the undeflected condition, illustrated in solid outline, the contacting portion 50 of the contacts is slightly upwardly inclined. As the PLCC J-lead corresponding to that contact is brought into bearing relation therewith during insertion, it urges the contacting portion downwardly, and with continued downward motion, the inside surface of the contacting portion gangs the outside surface of the terminal portion 52. With further downward motion, the contact is moved into its totally deflected condition illustrated in dashed outline, where the end 52 is in abutting relation with the free end of the partition 64. The terminal portion 52 to partition 64 abuttment acts as a surface against which the curved-beam-spring reacts producing an upward force against the J-lead. The upward force produces a biasing tension that insures the mechanical contact and electrical interconnection therewith. In addition, the abuttment acts as a stop which limits the downward travel of the contacting portion 50 such that it prevents over-stressing the contacts of the inner and outer rows. The contacts thereby remain within their resilient region, and are not thereby subjected to undesireable plastic deformation. The ends of the partitions thus also act as anti-overstress shelves.

Figure 4:
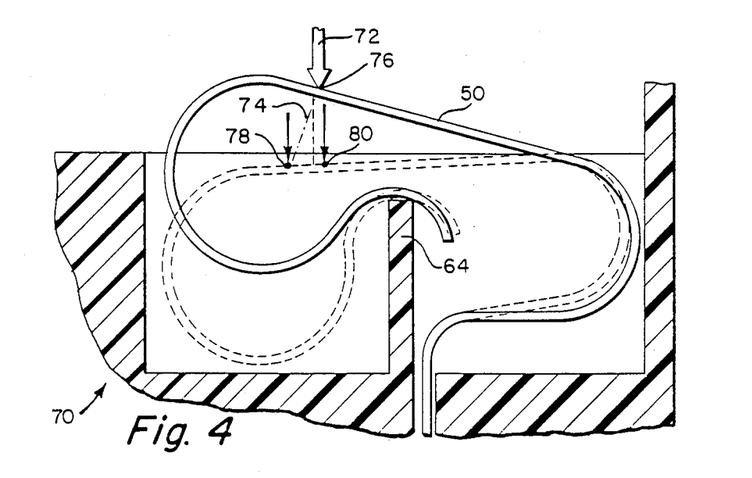
FIG. 4 is a partial sectional view of the wiping of the bottom surface of a J-contact and also of the action of the curved-beam-spring portion of the contact during PLCC insertion and in the as-inserted condition thereof.

Referring now to FIG. 4, generally designated at 70 is a partial sectional view illustrating the wiping action of the inner and outer contacts against the bottom surface of the corresponding J-leads. In the undeflected condition illustrated in solid outline, the leads of both the inner and outer contacts are biased upwardly by the cantilevered beam contacting portions thereof. A force 72 representative of the bottom surface of a J-lead is illustrated at the time when it just contacts the contacting portion of the several contacts in their upwardly inclined position. With continued insertion of the PLCC, the bottom surfaces of the J-leads drive the several contacting portions downwardly, which pivot about their cantilevered arms, downwardly to their deflected condition illustrated in dashed outline. As the arms pivot, the material of the contacting portions 50 undergoe translation in an arc, schematically illustrated at 74, while the J-lead remains in the same relative position, such that the surface of the contacting portion slides away under the J-lead wiping the confronting surface thereof. A material point 76 of the contact at the J-lead to contact interface moves about the arc such that it moves vertically and horizontally to a point designated 78. The distance to a point 80 represents the amount of wiping, which cleans the mating surfaces to insure the optimum connection therebetween.

Figure 5:
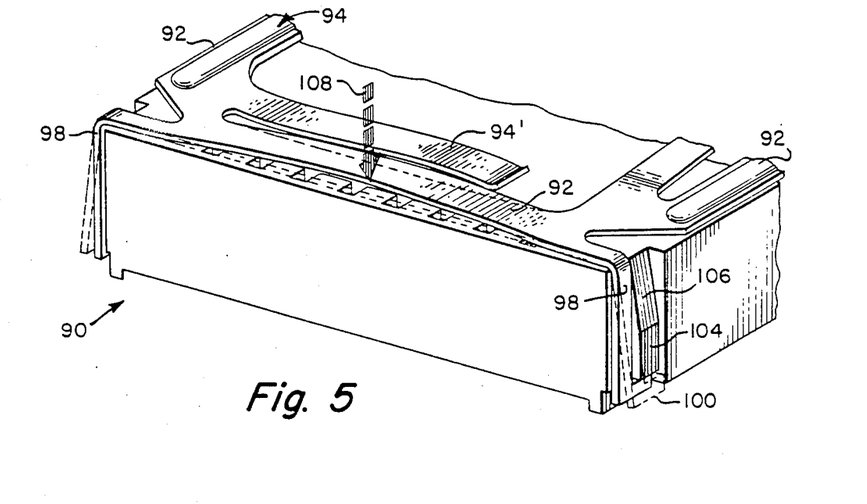
FIG. 5 is a partial perspective view illustrating in solid outline the cover in its latched condition and illustrating in dashed outline the latch-release action of the monolithic cover.

Referring now to FIG. 5, generally designated at 90 is a partial perspective view illustrating the snap-latchable action of the cover of the instant invention in its latched and unlatched conditions respectively in solid and dashed outline. The cover 90 is constituted by four side walls 92, three being shown in FIG. 5, closed on themselves in a rectangular configuration. Resilient finger beams 94 are stamped or otherwise formed integrally with the cover 90 such that each of the beams depends from a respective side wall 92 and is angled with respect to the plane of the cover inwardly towards the socket body. These bent spring beams define resilient fingers that impart a normal force against the PLCC when they are deflected towards the plane of the cover during pivoting motion towards and in the aslatched condition. A rib generally designated 94 best seen in FIG. 2 is stamped or otherwise formed in and along three of the sides 92 of the cover. The rib 94 provides strength thereto, preventing the deflection of the corresponding side portions, in which the rib is formed, as well as preventing the torsion thereof. On two of the corners of the cover latching arms 98 depend therefrom towards the PLCC and, in the open condition of the cover, are slightly outwardly flaired as shown in dashed outline. The amount of flairing is selected to allow their clearance over the confronting surfaces of the insulative socket body as the cover is pivoted into its latched condition. The ends of the latching arms 98 form hooks 100 at right angles to their direction of elongation, which hooks 100 cooperate with shoulders provided on the insulative body and snap-latch releasable thereonto in a manner to be described. On the remaining two ends of the cover are integrally formed depending arms 102 defining bearing races to be described as best seen in FIG. 6.

In the open condition of the cover illustrated in dashed outline, the condition of the tension in the cover is such that the latch arms are positioned in their outwardly flaired condition. With pivotal motion of the cover to its closed condition, the resilient finger beams thereof at some point abut the top surface of the received PLCC urging the PLCC downwardly against the upward force resisting the motion imparted by the several curved-beam-spring portions of the inner and outer contacts. The continued downward movement of the cover pushes the PLCC into seating relation on the web with the several J-leads in contact with corresponding contacting portions of the inner and outer rows of contacts, and no further downward motion is possible. The fingers at this point become like fulcrums, and tension is produced in the cover as reaction forces are produced therein. The tension is such that it produces a net upward force therein, so that the region of the cover free from the U-shaped rib, namely the cover portion extending between the latch arms, experiences a net upward force, which tends to cause it to deflect about its mid-point away from the PLCC. As it is being deflected, it pulls the latch arms toward each other a distance selected to bring the hook ends under corresponding shoulder portions 104 provided therefor on the insulative socket body. The cover is thereby latched into a closed condition. The body includes surfaces 106 that are beveled to provide latch guideways as the cover pivots to its closed condition. To release the cover a mechanical force 108, as by pressing with a finger, is imparted to the side portion of the cover not having the rib, which overcomes the unbalanced upward force induced by the action of the several resilient fingers, and reverses the movement of the latch arms moving them away from each other until they free the shoulders, as shown in dashed outline, at which time the resilient force imparted by the fingers snaps the cover open.

Figure 6:
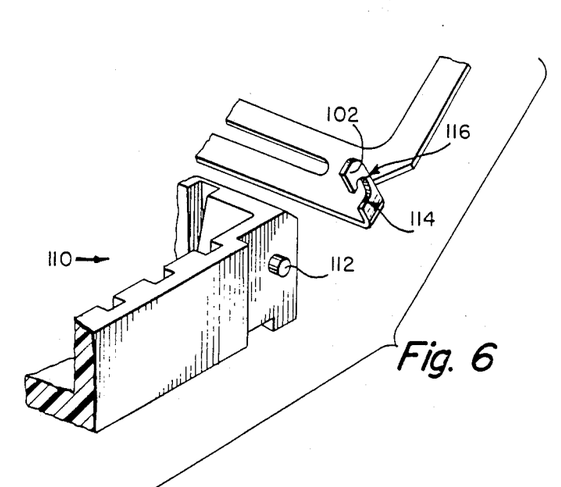
FIG. 6 is a partial perspective view illustrating the cooperative complementary pivot defining elements of the cover and monolithic socket body.

Referring now to FIG. 6, generally designated at 110 is a partial, perspective view illustrating the complementary cooperative pivot defining elements on the cover and insulative body. Laterally extending posts 112 are integrally provided on rear ones of the corners of the insulative body. These posts define pivot rods. The arms 102 of the cover are provided with integrally formed slots generally designated 114, which open to the rearside of the cover and have a width that is larger than the diameter of the posts such that the slots are thereby able to be slidably received over the posts. The slots 114 are in communication with hollows generally designated 116 defined by C-shaped walls provided below the slots 114, which walls define bearing races that cooperate with the pivot rods to define a releasable pivotal attachment for the cover. To mount the cover to the insulative body, the cover is simply held vertically with the slots in alignment with the posts, and it is moved downwardly until it is stopped by abuttment thereagainst. The cover is then manually pivoted downwardly to its closed position and the C-shaped walls abut and bear against the pivot rods defining a pivotal bearing race therewith.

Figure 7:
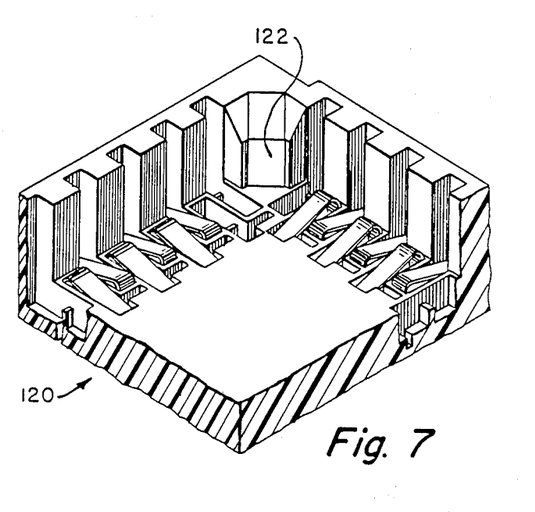
FIG. 7 is a partial perspective view of a mechanical polarization structure of the monolithic socket body of the invention.

Referring now to FIG. 7, generally designated at 120 is a partial, perspective view of a mechanical polarization surface provided on one of the corners of the insulative body. When looking at the drawing of FIG. 1, the mechanical polarization surface is preferably put on the front left hand corner post. The mechanical polarization, unlike the other alignment surfaces to be described, includes a forty five degree surface 122. The surface 122 mates with a complementary forty five degree surface on the PLCC and in such way that only when the two confronting surfaces are in matching relation can the PLCC be received in the socket opening. Otherwise, the mechanical mismatch prevents improper PLCC insertion.

Figure 8:
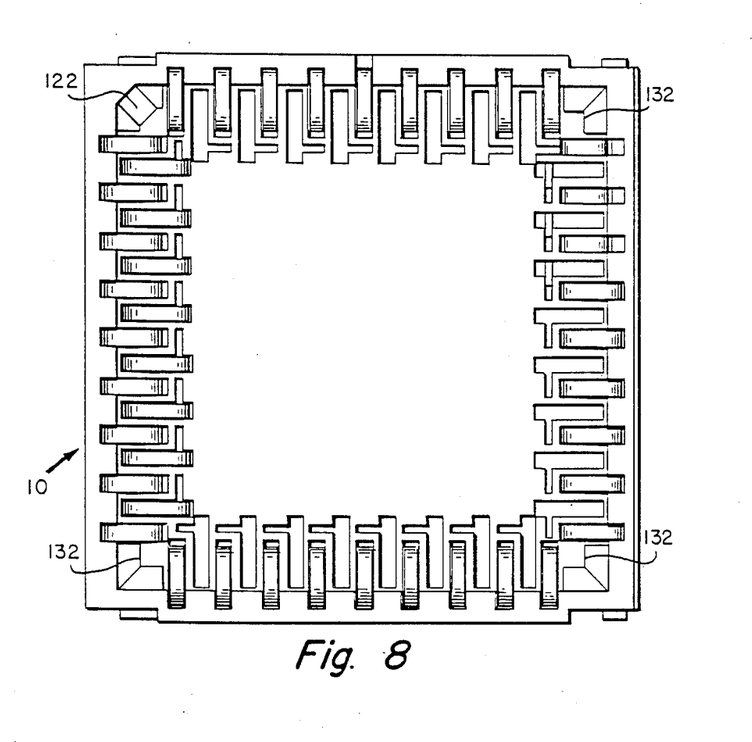
FIG. 8 is a plan view of the monolithic socket body showing the corner structure which defines the PLCC alignment surfaces thereof.

Referring now to FIG. 8, generally designated at 130 is a plan view of the insulative socket body illustrating centering surfaces 132 provided on the remaining three corners of the insulative body. The centering surfaces 132 define right angles that are precisely located so as to accept the corresponding right-angled corners of the PLCC received in the socket. The right-angled surfaces of the remaining three corners provide centering forces which insure that the J-leads are in proper alignment to corresponding ones of the contacting portions of the inner and outer rows of contacts.

Many modifications of the presently disclosed invention will become apparent to those skilled in the art.

What is claimed is:

1. A socket for a plastic leaded chip carrier having a bottom and having J-leads laterally extending peripherally therearound with J-lead portions confronting the bottom of the plastic leaded chip carrier and defining a first generally rectangular pattern, said socket receives the plastic leaded chip carrier along reciprocal directions of insertion and removal in such a way that there are minimal forces produced during insertion and removal thereof along said reciprocal directions, comprising:

an insulative body defining a plastic leaded chip carrier receiving seat around which seat plural contact receiving openings extend through the insulative body in a second generally rectangular pattern, with each of the openings thereof corresponding to a different one of the J-lead portions confronting the bottom of the plastic leaded chip carrier;

plural resilient contacts individually slidably received in a different one of said insulative body openings;

each of said resilient contacts having a J-lead contacting portion that makes mechanical and electrical contact with a different J-lead portion confronting the bottom of the plastic leaded chip carrier, the resilient contacts having biasing means for urging the J-lead contacting portions to act in directions generally parallel to the reciprocal directions of insertion and removal;

a monolithic cover having biasing means operative along a direction generally parallel to said reciprocal direction of insertion and removal to seat the plastic leaded chip carrier received on the plastic leaded chip carrier receiving seat, and further operative to press each of the plastic leaded chip carrier J-lead portions confronting the bottom of the plastic leaded chip carrier against the J-lead contacting portions such that the biasing means of the cover overcomes the biasing means of the resilient contacts, such that the J-lead portions confronting the bottom thereby mechanically and electrically contact with the contacting portions of the plural contacts;

means for mounting the cover for movement towards and away from the body;

said cover having a generally rectangular frame including four walls closed on themselves;

a strengthening rib integrally formed with three of said walls;

first and second outwardly flared latch arms integrally formed at frame corners between which the wall along which the rib is absent extends;

a pair of shoulders respectively formed along regions of said insulative body confronting said first and said outwardly flared latch arms; and resilient fingers formed with and depending from said frame in such a direction that when the cover is moved towards the body the fingers deflect producing reaction forces in the frame that bow the wall along which the rib is absent transverse the direction of elongation thereof, therewith moving said outwardly flared latch arms integrally formed at said frame corners towards each other and ever confronting ones of said shoulders.

2. The low insertion force socket of claim 1, wherein said insulative body is integrally formed.

3. The low insertion force socket of claim 1, wherein said cover is integrally formed.

4. The low insertion force socket of claim 1, wherein said resilient contacts each have a loop defining a curved-beam-spring portion therealong.

5. The low insertion force socket of claim 4, wherein said contacts are integrally formed.

6. The low insertion force socket of claim 1, futher including means for mounting said cover to said insulative body.

7. The low insertion force socket of claim 6, wherein said cover mounting means is a pivotal cover mounting means.

8. An anti-overstress socket having long cycle life self-wiping contacts for plastic leaded chip carriers, comprising:
an insulative plastic leaded chip carrier receiving socket body having walls defining contact receiving openings through the socket body in a preselected geometry selected to match a J-lead geometry of a plastic leaded chip carrier to be received thereby;
said walls of each of said contact receiving openings including a partition that separates said openings into first and second chambers;
curved-beam contacts each being received in a corresponding one of said openings provided therefor in said insulative plastic leaded chip carrier receiving socket body;
each of said curved-beam contacts including a depending electrode tail slidably received in corresponding ones of said first chambers of said openings, a contacting portion coupled to said electrode tail in cantilevered relation and at such an angle thereto that the contacting portion is inclined away from the corresponding partition, a loop defining a curved-beam-spring coupled to and depending from the cantilevered contacting portion, and a stop and reaction bearing terminal coupled to the loop defining a curved-beam-spring in confronting relation to its corresponding partition;
whereby, upon plastic leaded chip carrier insertion, plastic leaded chip carrier J-leads bear against corresponding cantilevered contacting portions, which, pivoting in response thereto, move out from under the J-leads wiping same, until the J-leads drive the cantilevered contacting portions against the corresponding partitions with said terminals therebetween, which thereby limits further travel of the cantilevered contacting portions preventing overstress, and which provides a reaction force which urges the contacting portions into good mechanical and electrical contact with the corresponding J-leads, thereby ensuring maximum interconnection fidelity.

9. The self wiping anti-overstress socket of claim 8, wherein the openings are arrayed in concentric rectangular rings, in such a way that the dimension defined in between adjacent contacting portions is different from the dimension defined between adjacent electrode tail portions of said contacts.

10. The self wiping anti-overstress socket of claim 8, wherein said contacts are fabricated of resilient materials.

11. The self wiping anti-overstress socket of claim 9, wherein said contacts are fabricated of a resilient material, and where said contacts are fabricated in two different configurations, one configuration for one of the inner and outer rows and the other configuration for the other of the inner and outer rows, the principal difference between them being a bight that is formed therealong that has a length selected to make possible the differences in the dimensions between the contacting portions and the electrode tails.

12. The self wiping anti-overstress socket of claim 8, wherein the dimensions of the second chamber are selected with respect to the extension of the loop defining curved-beam-spring portions of the contacts so that the contacts are free from mechanical interference with said walls which insures their retention of their nominal form against contact induced deformations whereby they retain their resiliency and manifest a long cycle life.

13. The self wiping anti-overstress socket of claim 8, further including a cover, and means for mounting said cover to said insulative socket body.

14. The self wiping anti-overstress socket of claim 13, wherein said mounting means is a pivotal mounting means.

15. The self wiping anti-overstress socket of claim 14, wherein said insulative socket body is monolithic, and is integrally formed out of a suitable plastic material.

16. The self wiping anti-overstress socket of claim 14, wherein said cover is monolithic, and is integrally stamped from a resilient material.

17. The self wiping anti-overstress socket of claim 16, wherein said socket material is a metal.

18. A low cost plastic leaded chip carrier (PLCC) receiving socket, comprising:
a monolithic injection molded socket body having four side walls and an intermediate plastic leaded chip carrier strength providing web;
laterally outwardly extending pivot rods integrally formed on two opposing side walls of said monolithic socket body adjacent corners thereof defined at the intersection of said opposing side walls and an included side wall;
first and second opposing latch shoulders integrally formed in preselected positions on the same two side walls adjacent corners defined by the intersection thereof with the remaining side wall;
a monolithic cover having a generally rectangular frame;
resilient fingers integrally formed with and depending from said generally rectangular frame;
said frame including four constitutive walls closed at right angles on themselves;
a strengthening rib integrally formed with three of the four constitutive walls of the frame of the monolithic cover defining a generally U-shaped configuration thereby;
first and second arms integrally formed with said frame defining pivot rod bearing races, said races being formed at frame corners along which said U-shaped rib extends;

first and second latch arms integrally formed at frame corners between which the wall along which the rib is absent extends, said latch arms being flaired outwardly and extend a distance selected to correspond to the position of the shoulders on the monolithic body;

whereby, upon movement of the cover to its closed condition, the resilient fingers bear against the plastic leaded chip carrier the spring tension of which bows the un-reinforced rib, in such a way as to draw the latching arms towards each other and into engagement with the shoulders provided therefor on the insulative body.

19. The low cost plastic leaded chip carrier receiving socket of claim 18, further including means integrally formed with said monolithic socket for providing a mechanical polarization that only allows PLCC insertion in a correct orientation.

20. The low cost PLCC receiving socket of claim 18, wherein the PLCC has J-leads further including means integrally formed with said monolithic cover for providing alignment and centering surfaces that produce forces which automatically so guide the PLCC that its J-leads are properly aligned with corresponding socket contacts.

21. The low cost PLCC receiving socket of claim 18, further including a detent integrally formed with said monolithic socket body, which detent provides a visual reference by means of which the correct alignment and insertion orientation of the PLCC is visually corroborated.

22. The low cost plastic leaded chip carrier receiving socket of claim 18, wherein said monolithic socket is injection molded from plastic.

23. The low cost PLCC receiving socket of claim 18, wherein said cover is fabricated from metal, and wherein said stengthening rib is stamped into the constitutive walls defining the rectangular frame of the cover.

24. The low cost plastic leaded chip carrier receiving socket of claim 18, wherein said frame is stamped from a single piece of metal.

* * * * *